United States Patent
Jansen et al.

(10) Patent No.: US 8,937,707 B2
(45) Date of Patent: Jan. 20, 2015

(54) LITHOGRAPHIC APPARATUS, DEVICE MANUFACTURING METHOD, AND METHOD OF CALIBRATING A DISPLACEMENT MEASURING SYSTEM

(75) Inventors: Maarten Jozef Jansen, Casteren (NL); Andre Schreuder, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 366 days.

(21) Appl. No.: 13/551,361

(22) Filed: Jul. 17, 2012

(65) Prior Publication Data
US 2013/0050675 A1 Feb. 28, 2013

Related U.S. Application Data

(60) Provisional application No. 61/526,331, filed on Aug. 23, 2011.

(51) Int. Cl.
*G03B 27/52* (2006.01)
*G03B 27/54* (2006.01)
*G03F 7/20* (2006.01)

(52) U.S. Cl.
CPC ........ *G03F 7/70516* (2013.01); *G03F 7/70775* (2013.01)
USPC .............................. 355/55; 355/67

(58) Field of Classification Search
CPC .................. G03F 7/70775; G03F 7/70716
USPC ............ 355/52, 53, 55, 67, 72; 356/399–401, 356/500
See application file for complete search history.

(56) References Cited

U.S. PATENT DOCUMENTS

| | | | |
|---|---|---|---|
| 6,008,902 A | 12/1999 | Rinn | |
| 6,700,665 B2 | 3/2004 | Hill | |
| 7,139,080 B2* | 11/2006 | Hill et al. | 356/498 |
| 7,262,860 B2* | 8/2007 | Hill | 356/500 |
| 7,483,120 B2 | 1/2009 | Luttikhuis et al. | |
| 8,339,611 B2 | 12/2012 | Kuramoto | |

(Continued)

FOREIGN PATENT DOCUMENTS

| | | |
|---|---|---|
| CN | 101071276 A | 11/2007 |
| JP | 2000-146526 A | 5/2000 |

(Continued)

OTHER PUBLICATIONS

English-Language Abstract for Japanese Patent Publication No. 2000-146525 A, published May 26, 2000; 1 page.

(Continued)

*Primary Examiner* — Hung Henry Nguyen
(74) *Attorney, Agent, or Firm* — Sterne, Kessler, Goldstein & Fox P.L.L.C.

(57) ABSTRACT

An interferometric displacement measuring system operable to measure displacements of a movable object of the lithographic apparatus in a first direction using a measurement beam of radiation and a reflector. The reflector being substantially planar and substantially perpendicular to the first direction. Calibration is obtained using a first set of measurements of the angular position movable object. A phase offset in the measurement beam is affected. A second set of measurements of the angular position of the movable object is obtained. The interferometric displacement measuring system is calibrated based on the first and second sets of measurements.

20 Claims, 9 Drawing Sheets

(56) References Cited

U.S. PATENT DOCUMENTS

| | | |
|---|---|---|
| 2002/0171844 A1 | 11/2002 | Hill |
| 2003/0095265 A1 | 5/2003 | Hill |
| 2004/0135980 A1 | 7/2004 | Hill |
| 2004/0207824 A1 | 10/2004 | Lof et al. |
| 2005/0162664 A1 | 7/2005 | Hill |
| 2005/0179879 A1 | 8/2005 | Pril |
| 2005/0286042 A1 | 12/2005 | Schoormans et al. |
| 2007/0008457 A1 | 1/2007 | Takahashi et al. |
| 2010/0110444 A1 | 5/2010 | Kuramoto |

FOREIGN PATENT DOCUMENTS

| | | | |
|---|---|---|---|
| JP | 2000-146525 A | 6/2000 | |
| JP | 2005-522683 A | 7/2005 | |
| JP | 2007-521462 A | 8/2007 | |
| JP | 2009-002706 A | 1/2009 | |
| JP | 2010-112768 A | 5/2010 | |

OTHER PUBLICATIONS

English-Language Abstract for Japanese Patent Publication No. 2009-002706 A, published Jan. 8, 2009; 1 page.

English-Language Abstract for Japanese Patent Publication No. 2000-146526 A, published May 26, 2000; 1 page.

\* cited by examiner

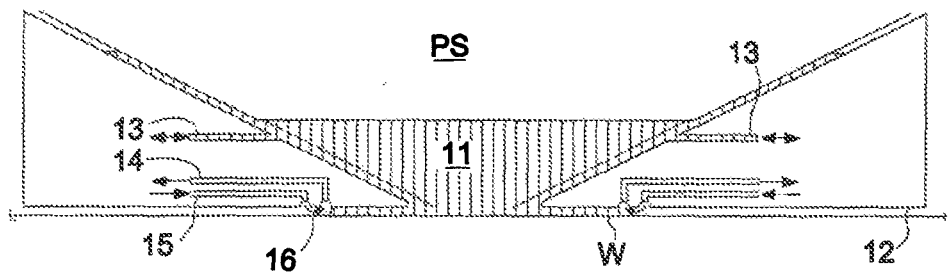
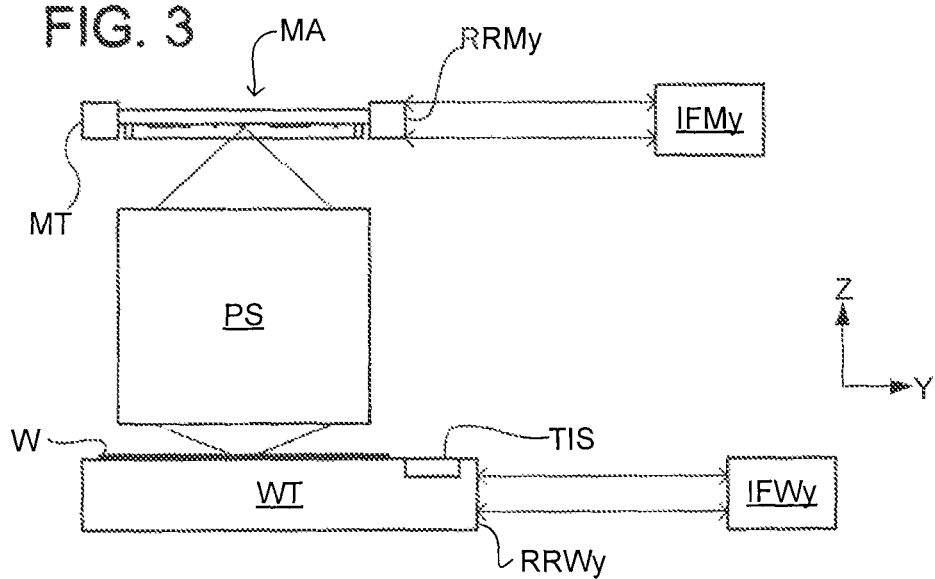
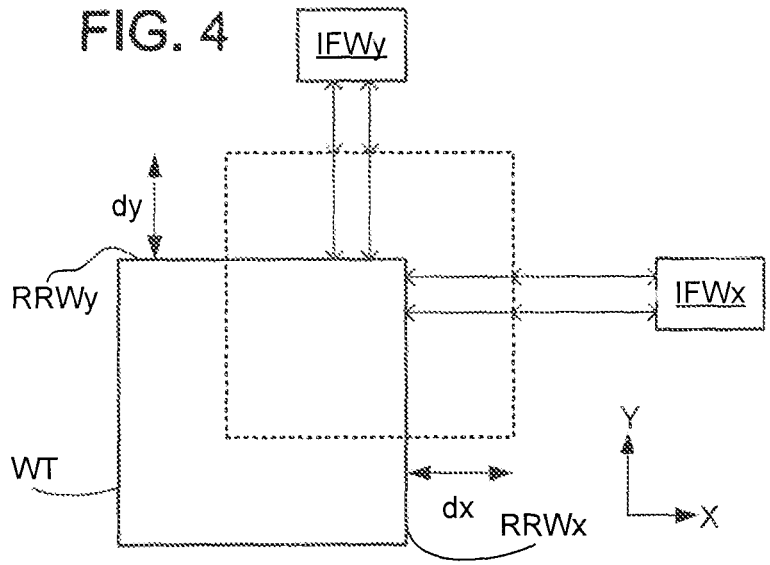

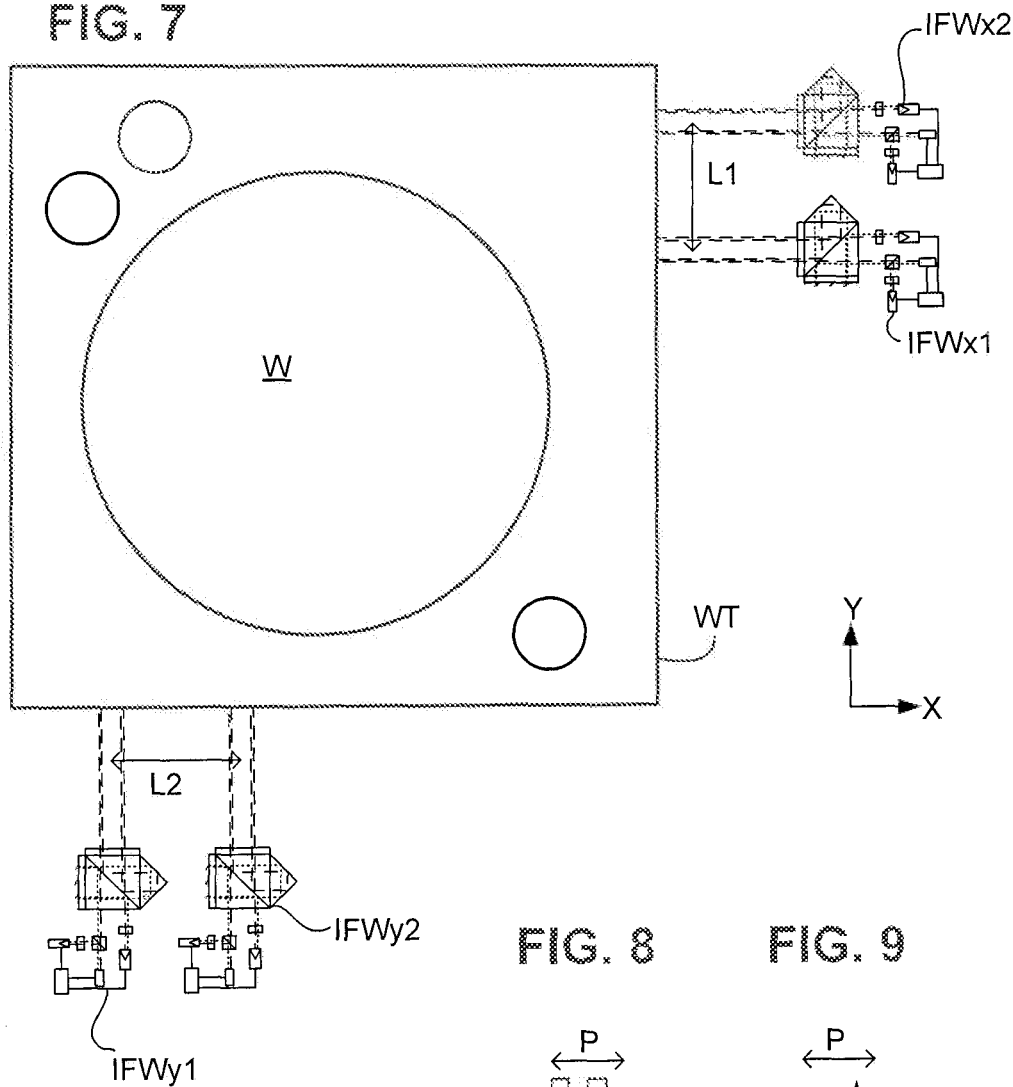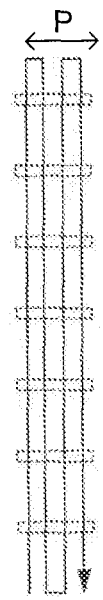

LITHOGRAPHIC APPARATUS, DEVICE MANUFACTURING METHOD, AND METHOD OF CALIBRATING A DISPLACEMENT MEASURING SYSTEM

CROSS REFERENCE TO RELATED APPLICATIONS

This application claims the benefit under 35 U.S.C. §119 (e) to U.S. Provisional Patent Application No. 61/526,331, filed Aug. 23, 2011, which is incorporated by reference herein in its entirety.

FIELD

The present invention relates to a lithographic apparatus, a device manufacturing method, and a method of calibrating a displacement measuring system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g., water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g., quartz) suspended therein, or a liquid with a nano-particle suspension (e.g., particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/ or an aqueous solution.

SUMMARY

In many lithographic apparatus, displacements of moving objects, such as a substrate table and a support member for patterning means, are measured using interferometer systems. In a typical heterodyne interferometer system, light from a coherent source (e.g. two orthogonally polarized beams having a small frequency difference) is split into measurement and reference beams. The reference beam having one polarization direction and one frequency is directed to a static reflector whilst the measurement beam having an orthogonal polarization and a small frequency difference is directed to a reflector mounted on the object whose displacements are to be measured. The two beams are then brought together and interfere. Where the beams interfere a fringe pattern will be formed. As the reflector mounted on the measured object moves, the path length of the measurement beam changes and the fringe pattern will shift position (in a heterodyne interferometer, the phase of the intensity signal of the measurement detector changes relative to the phase of the intensity signal of the reference detector), where the reference detector measures a beating signal representing the frequency difference. A static detector in the interference pattern will register a changing intensity signal and by counting peaks for both the reference detector and the measurement detector, displacements of the measured object can be determined. By interpolation, it is possible to measure displacements much smaller than the wavelength of the light used in the interferometer.

In many cases, the measured object may move in two or more orthogonal directions, e.g., X and Y. To measure displacements in, for example, the X direction, the measurement beam should be parallel to the X direction. To accommodate the fact that the measured object moves in, for example, Y and Z directions also, the reflector mounted on the measured object should be a plane mirror perpendicular to the measurement axis. Any unflatness or misalignment of the plane mirror will cause the interferometer to measure a false displacement in the direction of the measurement axis if the measured object moves in one of the orthogonal directions. Whilst great care is taken to ensure that the plane mirror is flat and perpendicular to the relevant measurement axis, perfection cannot be achieved and it is therefore usually necessary to measure the mirror surface and use the resulting mirror map to determine corrections to be applied to the measured displacements. Accuracy of measured displacements is therefore limited by the accuracy of the measurement of the mirror surface. A first known method of measuring the mirror surface involves measuring the positions of marks on a reference wafer. A second known method involves measuring apparent rotations of the measured object as it is translated in one direction in order to determine the local slope of the mirror. This slope is then integrated to determine the mirror surface.

It is desirable, for example, to provide an improved method for calibrating a displacement measuring system.

According to an aspect of the present invention, there is provided a lithographic apparatus, comprising a movable object, the movable object being movable in at least first and second directions, the first and second directions being mutually orthogonal and rotatable about an axis perpendicular to the first and second directions, a positioning system operable to move the movable object in at least the first and second directions, an interferometric displacement measuring system operable to measure displacements of the movable object in the first direction and angular position of the movable object about the axis using a measurement beam of radiation, the interferometric displacement measuring system including a reflector, the reflector being substantially planar and substantially, perpendicular to the first direction a control system operable to control the positioning system and the interferometric displacement measuring system to obtain a first set of measurements of the angular position of the movable object, effect a phase offset in the measurement beam and obtain a second set of measurements of the angular position of the movable object and a calibration system operable to calibrate the interferometric displacement measuring system on the basis of the first and second sets of measurements.

According to a further aspect of the present invention, there is provided a method of calibrating an interferometric displacement measuring system operable to measure displacements of a movable object of a lithographic apparatus in a first direction and angular position of the movable object about an axis perpendicular to the first direction using a measurement beam of radiation, the interferometric displacement measuring system including a reflector, the reflector being substantially planar and substantially perpendicular to the first direction, the method comprising: obtaining a first set of measurements of the angular position of the movable object, effecting a phase that is the measurement beam and performing a second set of measurements of the angular position of the movable object; calibrating the interferometric displacement measuring system on the basis of the first and second sets of measurements.

According to an even further aspect of the present invention, there is provided a device manufacturing method using a lithographic apparatus having a projection system to project an image onto a substrate held on a movable table, the method comprising: calibrating an interferometric displacement measuring system operable to measure displacements of a movable object of the lithographic apparatus in a first direction and angular position about an axis perpendicular to the first direction using a measurement beam of radiation, the interferometric displacement measuring system including a reflector, the reflector being substantially planar and substantially perpendicular to the first direction by obtaining a first set of measurements of the angular position movable object, effecting a phase offset in the measurement beam, obtaining a second set of measurements of the angular position of the movable object, calibrating the interferometric displacement measuring system on the basis of the first and second sets of measurements, projecting an image onto a substrate held on the movable table whilst scanning the movable table in the first direction and controlling the movement of the movable table during the projecting with reference to displacements of the movable table measured by the interferometric displacement measuring system.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 2 depicts, in cross-section, a barrier member which may be used in an embodiment of the present invention as an immersion liquid supply system.

FIG. 3 depicts selected parts of a lithographic apparatus according to an embodiment of the present invention.

FIG. 4 depicts an arrangement of orthogonal interferometer systems in an embodiment of the present invention.

FIG. 7 depicts another arrangement of orthogonal interferometer systems to measure displacements of a movable object in two orthogonal directions as well as rotations about an axis.

FIGS. 8, 9 and 10 depict scanning paths usable in embodiments of the present invention.

Figure 1:
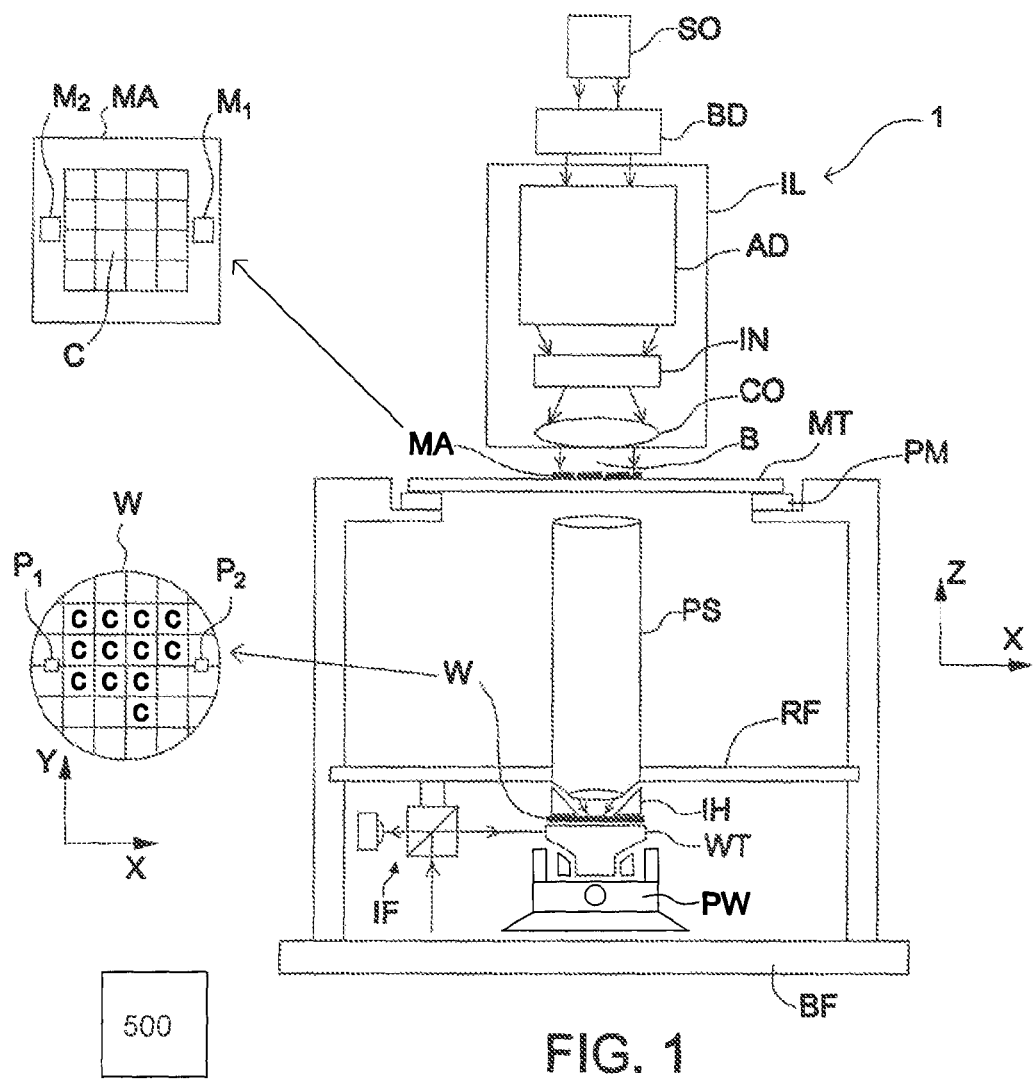
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus comprises an illumination system (illuminator) IL configured to condition a radiation beam B (e.g., UV radiation, DUV radiation or EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure. In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus a fluid, in particular a liquid for example an immersion liquid, is provided between the final element of the projection system and the substrate using a liquid supply system IH to enable imaging of smaller features and/or increase the effective NA of the apparatus. An embodiment of the present invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

An arrangement which has been proposed is to provide the liquid supply system with a liquid confinement member which extends along at least a part of a boundary of the space between the final element of the projection system and the substrate table. Such an arrangement is illustrated in FIG. 2. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824, which is incorporated by reference herein in its entirety.

FIG. 2 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g., air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

Many other types of liquid supply system are possible. The present invention is neither limited to any particular type of liquid supply system, nor to immersion lithography. The present invention may be applied equally in any lithography. In an EUV lithographic apparatus, the beam path is substantially evacuated and immersion arrangements described above are not used.

A control system 500 controls the overall operations of the lithographic apparatus and in particular performs an optimization process described further below. Control system 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the present invention one computer can control multiple lithographic apparatuses. In an embodiment of the present invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

In an embodiment, the lithographic apparatus may comprise an encoder system to measure the position, velocity, etc. of a component of the apparatus. In an embodiment, the component comprises a substrate table. In an embodiment, the component comprises a measurement and/or cleaning table. The encoder system may be in addition to the interferometer system described herein for the tables. The encoder system comprises a sensor, transducer or read head associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or read heads. The one or more of sensors, transducers or read heads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or cleaning table) has one or more of sensors, transducers or read heads that cooperate with the scale(s) or grid(s) to determine the position, velocity, etc. of the component.

FIG. 3 depicts the projection system and stages of the lithographic apparatus 1 in order to explain the displacement measuring system. In a scanner type lithographic apparatus, the support member MT for the patterning means MA is moveable in the Y direction over a range sufficient to scan the entire pattern area through the field of view of the projection system PS. It may also be positionable over smaller ranges in the other degrees of freedom. The position of the support member MT is measured in at least one direction, e.g., the Y direction by an interferometric displacement measuring system IFMy. For convenience this is referred as the mask Y direction interferometer. The mask Y direction interferometer directs one or more beams of coherent radiation against a reflector RRMy provided on the side of the support member MT and measures changes in the optical path length traversed by the measurement beam as a result of changes in the position of the support member MT. In an embodiment the reflector is a plane mirror attached to the support member MT and extending perpendicular to the Y direction. Desirably the extent of the plane mirror is greater than the ranges of movement of the support member MT in the X and Z directions.

In an embodiment the mask Y interferometer directs a plurality of measurement beams against the reflector RRMy.

These beams are substantially parallel but spaced apart in the X and/or Z directions. Signals derived using the respective beams may be averaged to minimize errors or used to measure rotations of the support member MT about the Z and X axis. In an embodiment corresponding interferometric displacement measuring systems are provided to measure displacements in the X and/or Z directions and/or rotations about the Y axis. In an embodiment displacements in one or more directions and/or rotations about one or more axis are measured using other types of sensors such as encoders, capacitative sensors and/or air gauges. In embodiments combinations of different types of sensors are used for cross calibration and/or to define reference positions. In principle, an interferometric displacement measuring system measures only displacements of an object not the absolute position thereof so that it is desirable to provide an arrangement to determine when the measured object is at a reference position from which movements can be tracked. In the present description, the term interferometric displacement measuring system may refer to arrangements that measure displacements of a single object in a single degree of freedom using one or more measuring beams and one or more reference beams. However, the term may also apply to a complex system that measures displacements in multiple degrees of freedom of one or more objects using multiple reference beams and respective reference beams.

As also depicted in FIG. 3, similar arrangements are provided to measure the displacements of the substrate table WT in one or more degrees of freedom. The substrate table is positionable in two orthogonal directions with a range of movement larger than the corresponding dimensions of the substrate to enable the entire surface of the substrate to be exposed. In an embodiment the substrate table WT is displaceable in the other direction over a smaller range and rotatable about three orthogonal axes. By way of example only, FIG. 3 depicts wafer Y interferometer IFWy which directs measurement beams against a reflector, e.g., a plane mirror RRWy, provided on the side surface of substrate table WT. As for the support member MT, in an embodiment multiple interferometer systems measure displacements in respective axes as well as rotations about perpendicular axes either alone or in combination with other position and/or displacement measuring systems. In an embodiment an image sensor TIS provided on the substrate table is used to detect the position of an aerial image of a marker on the patterning means MA and thereby determine the relationship between co-ordinate systems at substrate level and mask level.

FIG. 4 shows how the points on the substrate table WT at which the measurement beams of the substrate table X interferometer move when the substrate table is moved in the Y direction, e.g., by distance dy, and similarly the points at which the measurement beams of the substrate stage Y interferometer IFWy intersect the Y reflector RRWy move when the substrate table is moved in the X direction, e.g., by distance dx. From this drawing it can be understood that if the plane mirrors acting as retroreflectors are not flat, movement in one orthogonal direction will cause an apparent movement in the other direction causing a cross-talk effect. To minimize such effects, the substrate table is in an embodiment manufactured from a solid piece of material of high rigidity and low co-efficient of thermal expansion, such as Zerodur™ or a glass-ceramic. The side surfaces of the substrate table are polished to a high degree of accuracy before the plane mirrors are fixed thereto. In spite of these efforts there can still be deviations from perfect flatness sufficient to affect the accuracy of the interferometric displacement measuring systems significantly compared to the error budgets set for a high precision lithographic apparatus.

To minimize errors in the measured displacements of the substrate table WT and support member MT, it is common to measure the shape of the plane mirrors used in the interferometric displacement measuring systems and correct for the measured shape. Several approaches to this are known. In one approach, a reference wafer having a plurality of reference marks at known positions is used. The reference wafer is placed on the stage and the stage moved to detect the reference markers using an alignment sensor whilst the displacements are tracked. If the relative positions of the reference markers on the reference wafer are known, errors in the displacement measuring system caused by imperfections in the plane mirrors can be determined. This method is however slow and limited by the accuracy of positioning of the reference markers on the reference wafer. If this method is used often to determine drift in the shape of the mirrors, which may be caused by thermal cycling for example, there is an undesirable loss of throughput. Furthermore one can also measure the shape of the mirrors merely to monitor if mirror drift has occurred (i.e. no update is performed).

Another method of measuring the shape of the mirrors can be used if the interferometers have multiple beams spaced apart in directions orthogonal to the relevant measurement axis so that the local slope of the mirror can be measured. With such an interferometer, the shape of the mirror can be determined by integrating the detected slope as the relevant table is scanned in a direction perpendicular to the measurement beams. This measurement can be performed rapidly but the present inventors have determined that its repeatability is not sufficient to measure drift in mirror shape.

Figure 5:
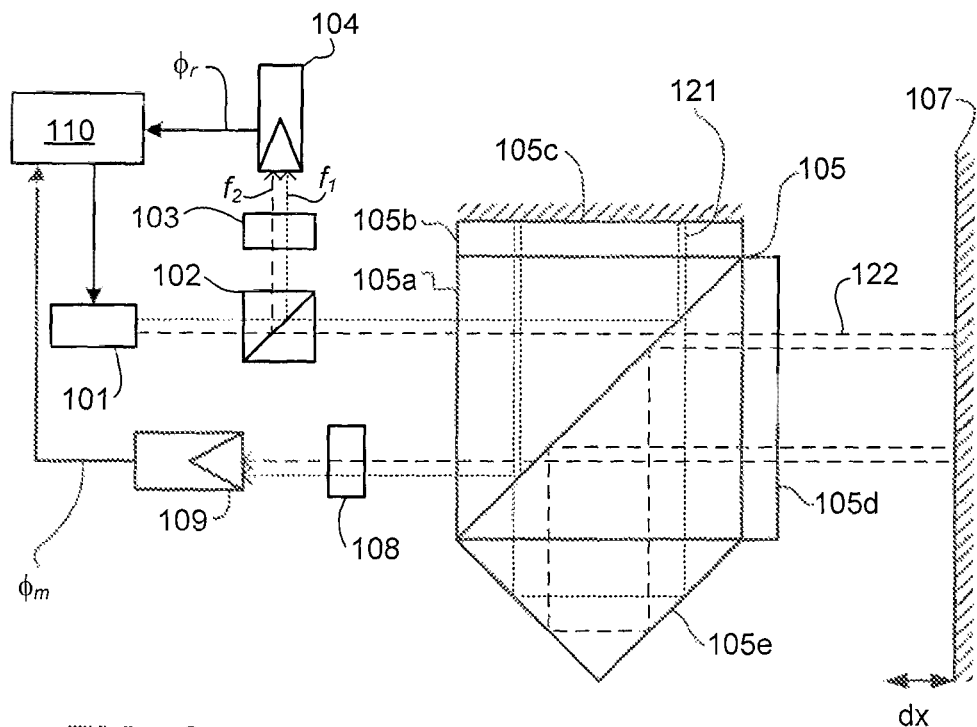
FIG. 5 depicts an interferometer system according to an embodiment of the present invention

FIG. 5 is a simplified schematic diagram of a double-pass heterodyne interferometric displacement measuring system for measuring linear displacements of an object in one degree of freedom. A radiation source 101, including e.g., a HeNe laser, emits coherent radiation having two orthogonal polarization states and two frequencies $f_1$ and $f_2$. In a typical laser the frequency offset between $f_1$ and $f_2$ is 15 MHz. A beam splitter 102 diverts a known fraction of that beam, e.g., less than about 5%, to intensity sensor 104 via polarizer 103. Intensity sensor 104 provides a reference signal having a phase that is used for referencing to the phase of the measurement signal. The main part of the beam passes to beam splitter block 105 which diverts one polarization state to form reference beam 121 and the other polarization state to form measurement beam 122.

Beam splitter block 105 comprises a polarizing beam splitter 105a having a first face receiving the main part of the beam from source 101. Radiation not diverted by the polarizing beam splitter exits by a second face, opposite to the first face, propagates to the plane reflector 107 on the movable object and is returned by plane mirror 107. The second face of the polarizing beam splitter is provided with a quarter-wave ($\lambda/4$) plate 105d oriented to rotate the polarization state of the radiation passing through it. The radiation diverted by the polarizing beam splitter exits a through a third face on which are provided a second $\lambda/4$ plate 105b and a plane mirror 105c which directs the reference beam back into the polarizing beam splitter.

On a fourth face of the polarizing beam splitter 105a is a prism 105e arranged to internally reflect the beams exiting fourth face and return them to the beam splitting surface. As a result of the rotation of the polarization states of the returned beams by the $\lambda/4$ plates 105b, 105d, the beams returned by the static and moving reflectors 105c, 107 when first directed thereto do not exit through the first face of the beam splitter 105a but rather are directed to the fourth face and the prism mounted thereon. The measurement and reference beams therefore make a second pass to their respective reflectors before exiting the first face of the polarizing beam splitter 105a. This has the effect that the path length of the measurement beam changes by four times the distance moved by the movable object.

The two beams exiting the first face of the polarizing beam splitter pass through 45 degree polarizer 108 so that they can interfere. Sensor 109 measures the intensity of the interfered beams to give the measurement signal. The optical path of the reference beam 121 and the plane mirror 105c may be referred to as the reference arm of the interferometer whilst the optical path of the measurement beam 122 and plane mirror 107 may be referred to as the measurement arm. If the moveable object whose displacements are to be measured shifts by a distance dx along the measurement axis, the path length of the measurement beam 122 changes by an amount 2 dx. As a result of this, the fringe pattern caused where the beams interfere and therefore the phase of the intensity signal output by detector 105 changes with time with respect to the phase of the intensity signal output by detector. Thus, the displacements of the movable object can be determined from the reference signal $\phi_r$ and the measurement signal $\phi_m$ as follows:

$$\text{displacement}(t) = \frac{(\phi_m(t) - \phi_r(t))}{2\pi} \cdot \text{pitch}$$

$$I_m(t) = \cos(\phi_m(t)),$$

$$I_r(t) = \cos(\phi_r(t)),$$

$$\phi_m(t) = \underbrace{2\pi(f1-f2)t}_{\text{beat frequency modulation}} + 2\pi \frac{OPD(t)}{\lambda}$$

$$\phi_r(t) = \underbrace{2\pi(f1-f2)t}_{\text{beat frequency modulation}}$$

Figure 6:
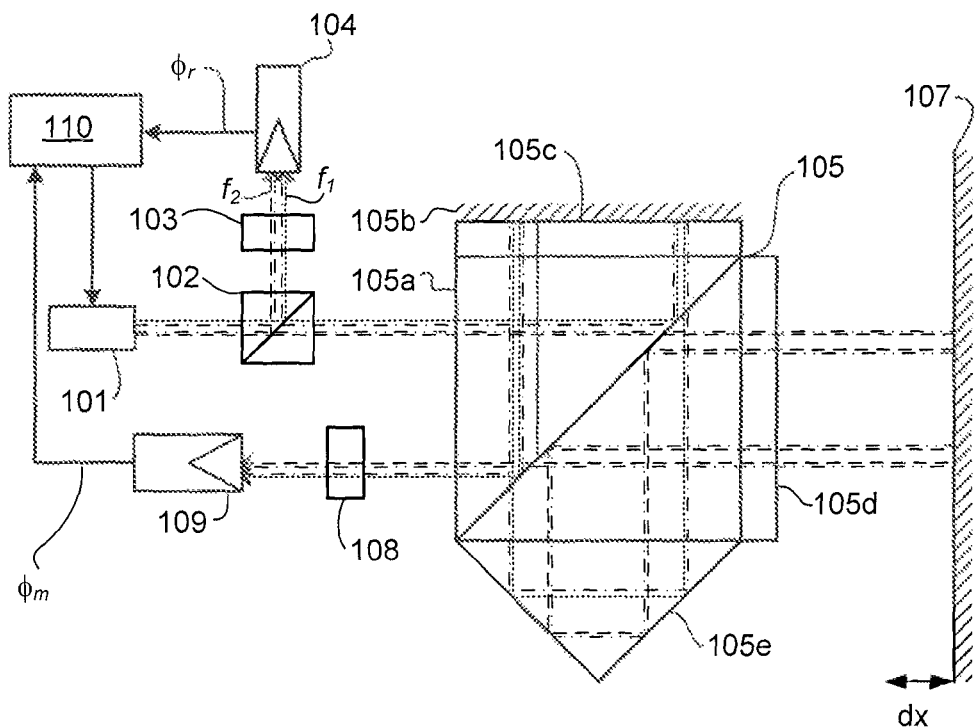
FIG. 6 depicts the interferometer system of FIG. 5 illustrating a frequency mixing effect.

OPD(t) is the optical path length difference between the beam length in the reference arm and the beam length in the measurement arm of the interferometer. The phase differences between the two beating signals $I_m$ and $I_r$ can e.g. be determined using a phase lock-in amplifier. The pitch of the phase cycle of the interferometer is determined by P=λ/n, wherein λ is the wavelength of the measurement beam and n is the number of passes made by the measurement beam along the measurement arm (i.e. to or from the reflector). Thus, for a double pass interferometer (as illustrated in FIGS. 5 and 6) having a wavelength of 623.8 nm, the phase cycle of the measurement signal equals to about 158 nm (e.g. in a double pass interferometer the beam goes to and from the mirror twice, resulting in n=4).

It will be appreciated that FIG. 5 is a greatly simplified diagram of an interferometric displacement measuring system and omits many arrangements that are used to eliminate other influences on the beam path length that may cause errors. For example, it is important to ensure that the refractive index of the medium traversed by the reference and measurement beams is equal and constant. Thus, in some embodiments the beam paths are flushed with gas of constant composition, temperature and pressure whilst avoiding turbulence. In other embodiments the beam paths are evacuated. In an embodiment, multiple beams having different wavelengths are used to detect and thereby compensate for changes in refractive index.

A known effect in interferometer systems is that due to imperfections in the optics of the interferometer system, for example by birefringence effects in materials used or misalignment of the elements, it is possible for mixing to occur between the measurement and reference beams (see FIG. 6), which ought to be separated due to their orthogonal polarization states. This can result in periodic errors in the interference signal. These errors have a periodicity corresponding to the phase cycle of the interferometer. The present invention also applies to single frequency homodyne interferometers (not described here) which have a very similar optical configuration. The main differences are the use of a single frequency laser and a (phase quadrature) phase sensor at the position of the measurement detector but no reference detector. In a homodyne interferometer there is also mixing of a reference beam into the measurement arm and of a measurement beam leaking into a reference arm. The nature of the periodic deviations is similar among both types of interferometers. Note that the periodicity of the phase correlated periodic errors can be calculated as pitch/N, wherein N is an integer number. Typically the periodic errors are dominated by the $1^{st}$ (N=1) and $2^{nd}$ (N=2) harmonic component.

The effect of the periodic error is explained further with reference to FIG. 7. This figure shows an arrangement in which substrate table WT is provided with plane mirrors RRWx and RRWy on two sides thereof. Each of these mirrors acts as the movable mirror for two interferometric displacement measuring systems so that there are four in total, IFWx1, IFWx2, IFWy1, IFWy2. The measurement beams of the two X-axis interferometric displacement measuring systems IFWx1, IFWx2 are separated in the Y direction by a distance L1 (assuming a perfect plane mirror) any changes in the difference between their outputs represents rotation of the substrate table WT about the Z axis (perpendicular to the X & Y axes). The same applies to the two Y-axes interferometers IFWy1, IFWy2. If rotations of the substrate table as measured by the two interferometer systems are denoted $Rz_x$ and $Rz_y$, then any change in $(Rz_x - Rz_y)$ as the substrate table moves represents a change in slope (i.e., an unflatness) of one of the plane reflectors. Accordingly in this example the rotation of the substrate table WT about the Z axis can be measured in an overdetermined manner.

Thus to measure the shape of one of the reflectors, e.g., the x-axis mirror RRWx, is moved in the direction (e.g., Y) parallel to the mirror whilst being held at a constant position in the direction perpendicular to the reflector. Apparent rotations of the substrate table as measured by the interferometers using the reflector being scanned represent changes in slope of the mirror. The mirror shape can therefore be determined by integration of the apparent rotations, after subtraction of any real rotations measured by the other axis interferometers.

In the above described procedure, the position in the direction perpendicular to the mirror at which the scan is carried out should not matter. However, where there is a periodic phase error in the interferometer, different results will be obtained if the scan is carried out at different positions. The errors deriving from the periodic phase error in the interferometer can be similar to or larger than changes in mirror shape over time (drift). Thus the scanning method becomes insufficiently repeatable to accurately measure mirror shape drift.

In an embodiment of the present invention therefore the measurement of the shape of the plane mirror is repeated with a phase offset, e.g., with the measured object displaced in the direction of the measurement axis. In an embodiment of the present invention two scans are performed with the measured object displaced by a distance substantially equal to P/2 between scans in order to eliminate the first harmonic of the periodic error. In an embodiment four scans are performed with the moveable object displaced by P/4 between each scan (i.e., scans are performed at positions 0, P/4, P/2, 3P/4) to eliminate the first and second harmonics of the periodic error. The resulting scan pattern is shown in FIG. 8. In an embodiment the scan positions may be (a/b)·(λ/c) where a, b, and c are integers, in particular a being odd, b being even and c being equal to twice the number of passes made by the measurement beam. Suitable values are a=1 or 3, b=2 or 4 and c=2 or 4. In an embodiment, further scans can be performed at appropriate intervals to eliminate higher harmonics of the periodic deviation. It is noted that also not necessarily equidistant offsets can be used to derive the corrected, phase averaged rotation angle error. The advantage of using integers is that the formula to derive the corrected measurements simplifies to a simple averaging operation.

Figure 10:
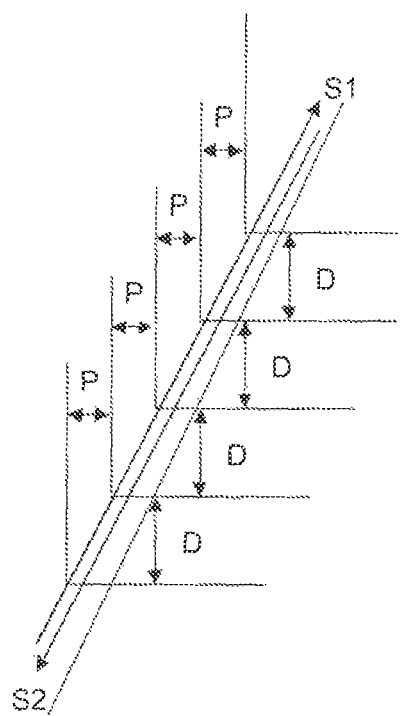

In an embodiment, deviations from flatness in the shape of the reflector are sufficiently small that an adequate map of the mirror shape can be obtained by measuring its slope at only a small number of positions along its length, shown in FIG. 8 as dashed boxes. In such a case, the necessary measurements to eliminate the phase errors can be obtained with an alternative scan pattern as illustrated in FIG. 9. In this procedure, the movable object is moved in the direction parallel to the mirror being mapped to the first sampling point. The mirror slope is then measured at a desired number of positions, e.g., 2 or 4, spaced apart in the direction perpendicular to the mirror. The movable object is then moved in the direction parallel to the reflector to the next sampling position and the slope measurements repeated, and so on. Other scan patterns can be used in embodiments of the present invention. In a further alternative embodiment a movement under an angle relative to the reflector (a so-called skewed scan) may be performed as shown in FIG. 10. For example, an angle of 158 μrad, results in periodic deviations each mm (indicated as distance D). Such an embodiment may be beneficial as with a single scan periodic errors can be eliminated. Performing a first scan (S1) combined with an 180 degrees phase offset for the second scan (S2) in the reverse direction results in a period deviation elimination when averaging these measurements. Alternatively spatial averaging (i.e. averaging each mm separately) or any combination thereof is also possible within the scope of the invention.

In the embodiments described above, phase offsets are generated by displacements of the movable object. In an embodiment, a controllable optical device is used to effect phase offsets. Examples of controllable optical devices include a liquid crystal based phase modulator, a modulating babinet-soleil compensator or a retractable plane plate.

In an embodiment of the present invention the measurement results deriving from the different scans are averaged to eliminate the periodic errors. In an embodiment differences between the periodic scans can be used to eliminate the periodic error. This can be done by phase, as follows:

$$rz_{average} = \int_0^{2\pi} (rzx(\phi) - rzy(\phi)) d\phi,$$

where φ is the phase of the interferometer measuring the reflector, or by position:

$$rz_{average} = \int_0^{pitch} (rzx(x) - rzy(x)) dx,$$

where x is position orthogonal to the reflector being measured. Thus, in an embodiment, the stepsize need not be related to pitch as above.

Figure 11:
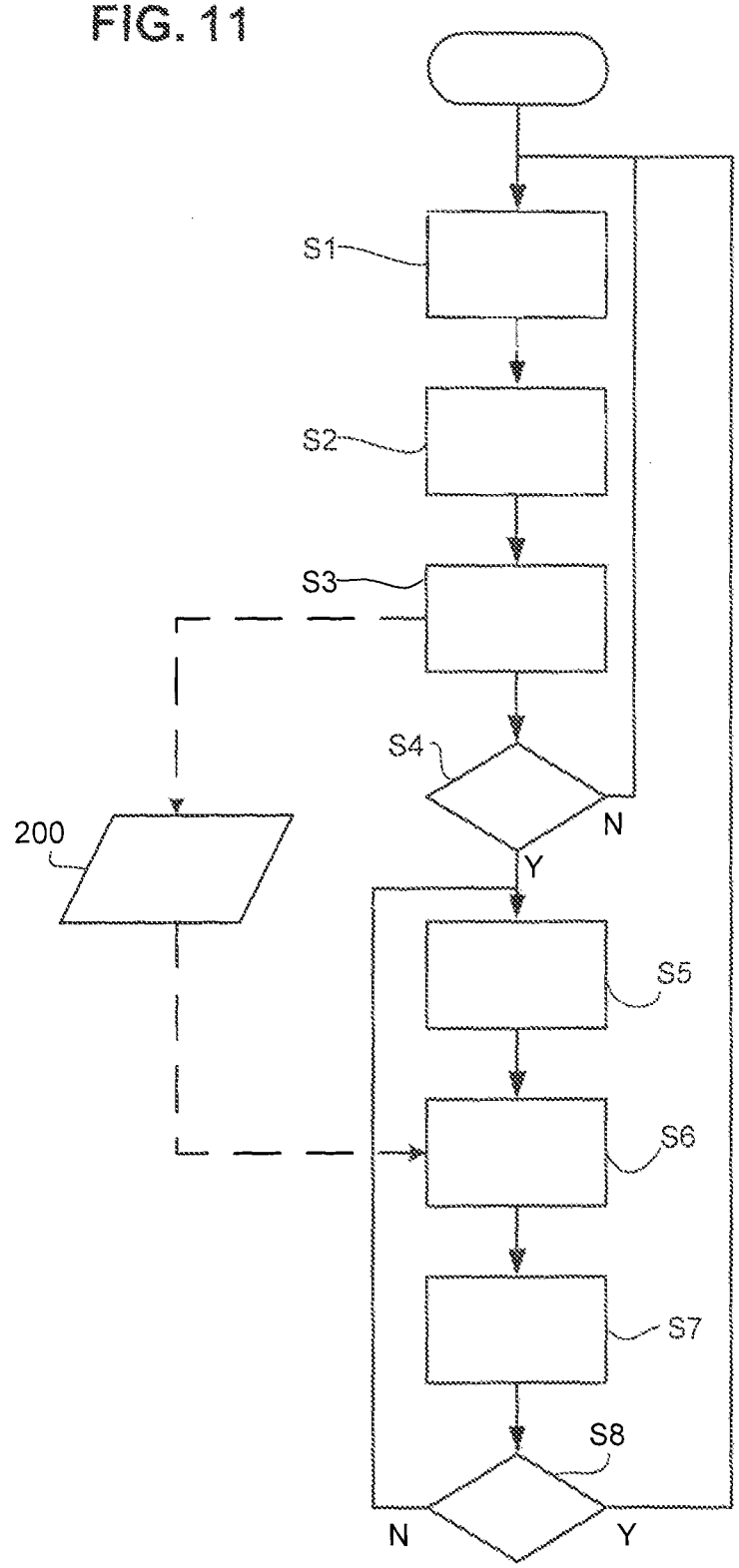
FIG. 11 depicts a method according to an embodiment of the present invention.

FIG. 11 illustrates a method according to an embodiment of the present invention. In step S1, a first scan is performed. For example to measure the surface contour of the substrate table Y mirror the substrate table is held at a reference position in the Y direction and scanned in the X direction throughout its complete range of movement.

In step S2 one or more error correction scans are performed. In the example, the substrate table is displaced in the Y direction by a distance equal to an appropriate fraction of the pitch of the periodic error and then scanned in the X direction to create a further wafer map. In step S3, the scan results are processed, e.g., by averaging, to develop a mirror map 200 which is stored in the apparatus. In step S4 it is determined whether the calibration process is successful, if not it is repeated as necessary.

If the calibration to be processed is correctly completed, in step 5 a production substrate is loaded onto the apparatus, exposed in step S6 and unloaded in step S7 for subsequent development and other processes. After complete exposure of a substrate, it is determine in step S8 whether a re-calibration of the interferometer mirrors is required. If so, the process returns to step S1 for re-calibration, if not the process returns to step S5 for exposure of a new substrate.

In an embodiment, the calibration of the interferometer mirrors is repeated after a certain period of time has elapsed or a certain number of wafers has been exposed. For example, the re-calibration may be performed daily. The calibration process according to the present invention can be performed in a few seconds and therefore daily performance of it does not impose an excessive loss of throughput on the apparatus. In this way, the present invention allows monitoring of drift in the mirror shape to be determined in a way that has not been convenient heretofore. Drift in the mirror shape can be caused by hysteresis in thermal cycling of the object to which it is attached in spite of the low coefficient of thermal expansion of the materials used and the substantially constant environment. Stresses imposed on the moveable object by its movement and/or by the repeated loading and unloading of substrate or masks can also cause changes in the mirror shape. In an embodiment of the present invention, the calibration process is performed in initial commissioning of the apparatus and after any downtimes for routine servicing or maintenance. In an embodiment, repeating the calibration is triggered by detection of errors, such as overlay errors exceeding a desired threshold, in output production.

In an embodiment of the present invention, the interferometer system that is calibrated is used to measure displacements of the moveable object, e.g., substrate table or support member or the patterning device, throughout production exposures. In an embodiment of the present invention, the calibrated interferometer system is used in turn to calibrate an encoder system that is configured to measure displacements of the moveable object during production exposures.

Figure 12:
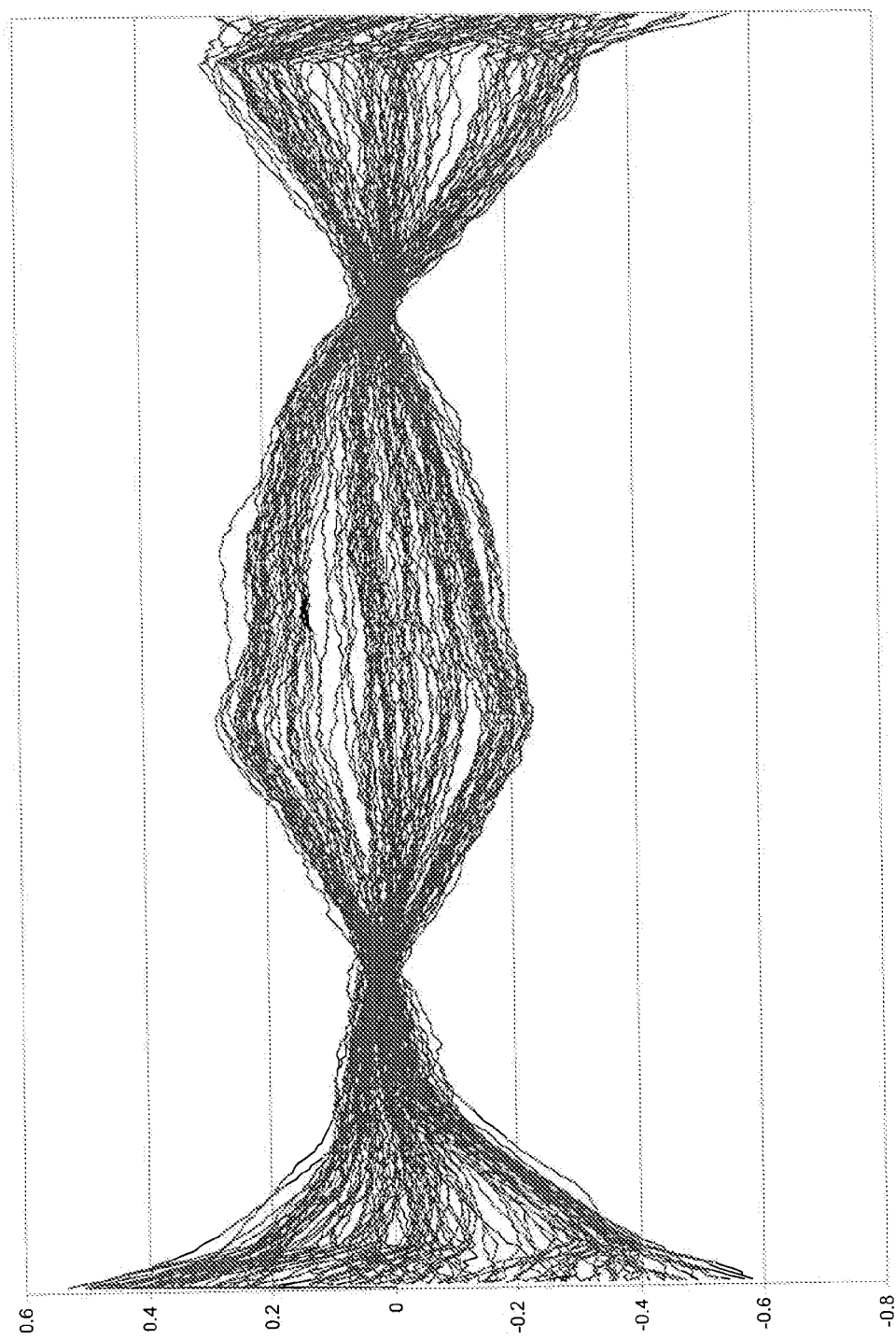
FIGS. 12, 13 and 14 depict measurement results derived from use of an embodiment of the present invention.
Figure 13:
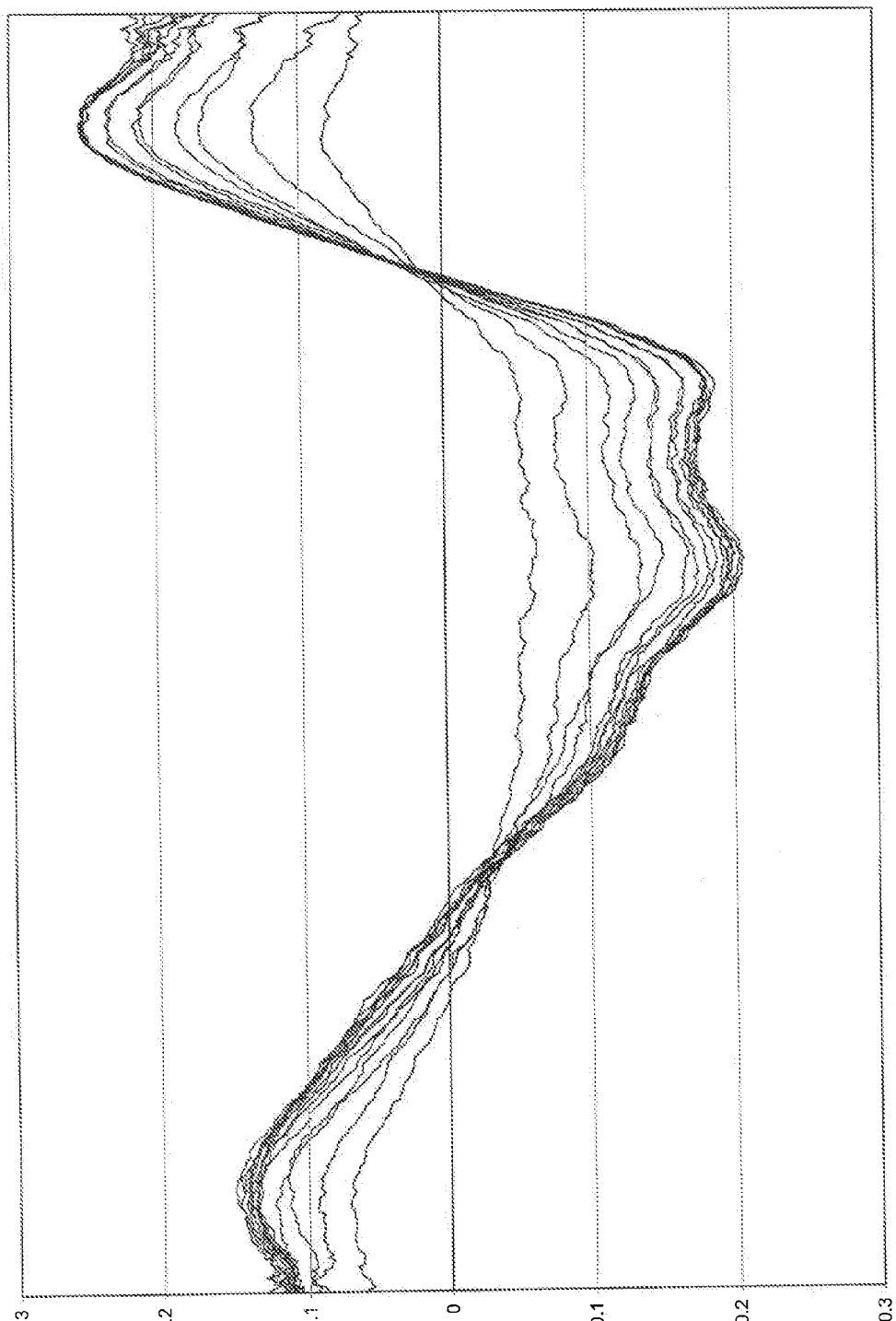
Figure 14:
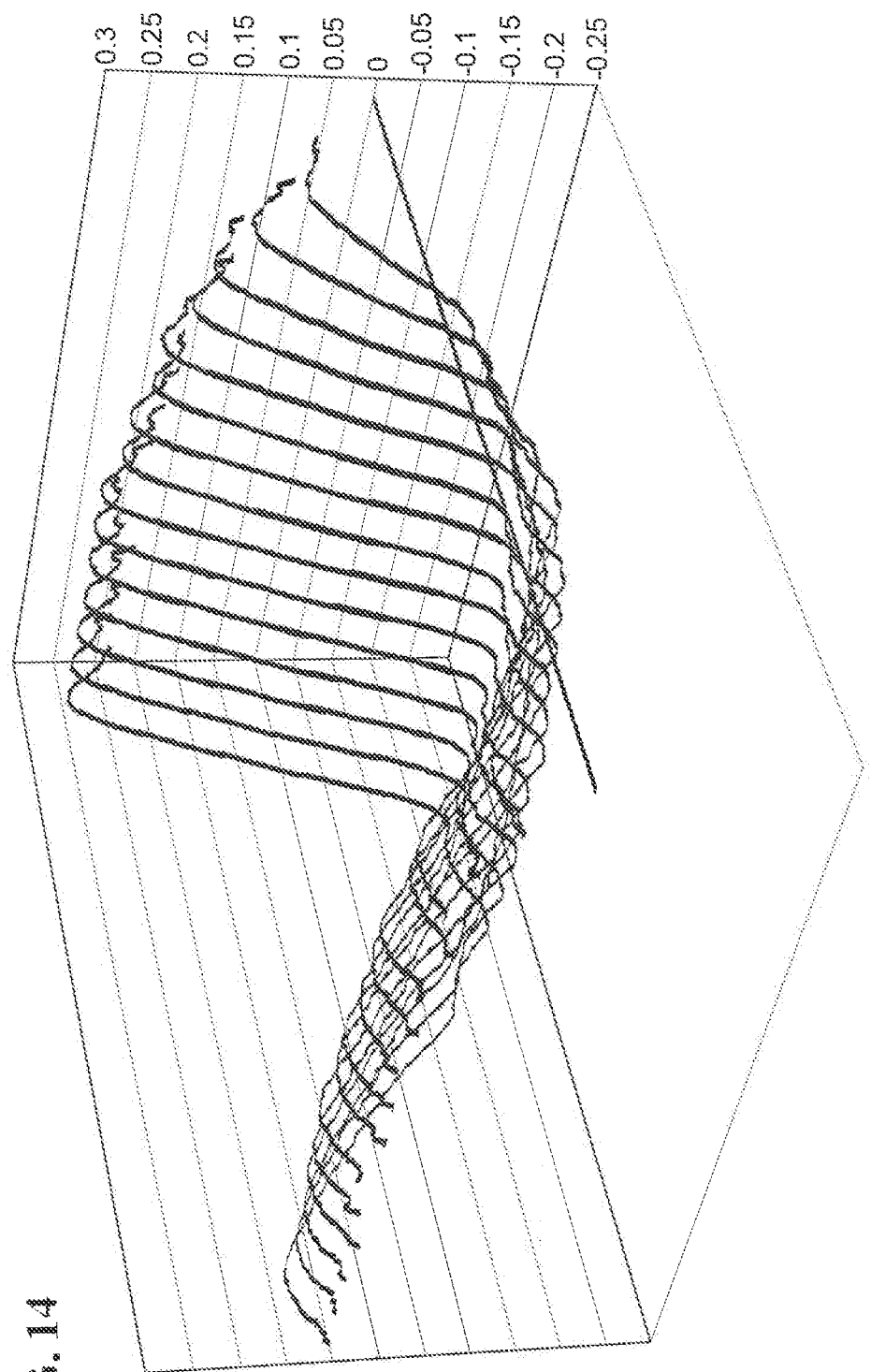

FIGS. 12, 13 and 14 show the results of experiments to validate the present invention. In these experiments, a plane mirror mounted on the side of the substrate table of a lithographic apparatus was scanned in the manner described above to obtain a mirror map. The scan was then repeated at three further positions displaced by approximately one quarter of the face pitch of the interferometric displacement system used in the direction perpendicular to the claim of the mirror. This sequence of four scans was then repeated at two hourly intervals. FIG. 12 shows the result of these scans; each line represents the difference between the reconstructed mirror map taken from that scan and the reconstructed mirror map obtained from the first scan in arbitrary unit. It can be seen that there is apparently substantial variation in the shape of the mirror but it is not possible to determine from this data whether that represents a true change in mirror shape or measurement error.

FIG. 13 shows the effect of applying the present invention. In this graph, each line represents a mirror map reconstructed from the averages of the scans taken at one time at different offsets. Again, what is shown is the difference in arbitrary units from the first scan. FIG. 14 shows the same data as FIG. 13 presented in three-dimensional form as a time ordered series which clearly shows that the change of mirror shape is a result of drift rather than measurement error.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157, 126, 13.5 or 6.25 nm).

The term "lens", where the context allows, may refer to any one or combination of various types of optical components, including refractive and reflective optical components.

While specific embodiments of the present invention have been described above, it will be appreciated that the present invention may be practiced otherwise than as described. For example, the embodiments of the present invention may take the form of a computer program containing one or more sequences of machine-readable instructions describing a method as disclosed above, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the present invention may be applied to any immersion lithographic apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A lithographic apparatus, comprising:
 a movable object, the movable object configured to move in at least first and second directions, the first and second directions being mutually orthogonal and rotatable about an axis perpendicular to the first and second directions;
 a positioning system operable to move the movable object in at least the first and second directions;
 an interferometric displacement measuring system operable to measure displacements of the movable object in the first direction and angular position of the movable object about the axis using a measurement beam of radiation, the interferometric displacement measuring system including a reflector, the reflector being substantially planar and substantially perpendicular to the first direction;
 a control system operable to control the positioning system and the interferometric displacement measuring system to obtain a first set of measurements of the angular position of the movable object, effect a phase offset in the measurement beam and obtain a second set of measurements of the angular position of the movable object; and
 a calibration system operable to calibrate the interferometric displacement measuring system on the basis of the first and second sets of measurements.

2. A lithographic apparatus, comprising:
 a movable object, the movable object configured to move in at least first and second directions, the first and second directions being mutually orthogonal;
 a positioning system operable to move the movable object in at least the first and second directions;
 an interferometric displacement measuring system operable to measure displacements of the movable object in the first and second directions in an overdetermined manner, the interferometric displacement measuring system including a reflector, the reflector being substantially planar and substantially perpendicular to the first direction;
 a control system operable to control the positioning system and the interferometric displacement measuring system to obtain a first set of measurements of the movable object, effect a phase offset in the measurement beam and obtain a second set of measurements of the movable object; and
 a calibration system operable to calibrate the interferometric displacement measuring system on the basis of the first and second sets of measurements and/or a monitoring system operable to monitor the shape of the reflector on the basis of the first and second sets of measurements.

3. The lithographic apparatus according to claim 1, wherein the control system is arranged to effect the phase offset by controlling the positioning system to displace the movable object so that there is a distance between its position in the first direction when the first set of measurements is obtained and its position in the first direction when the second set of measurements are obtained.

4. The lithographic apparatus according to claim 1, wherein the interferometer includes a controllable optical device and the control system is arranged to effect the phase offset by controlling the controllable optical device.

5. The lithographic apparatus according to claim 1, wherein the control system is further operable to control the interferometric displacement measuring system to effect a second phase effect and obtain a third set of measurements.

6. The lithographic apparatus according to claim 1, wherein the calibration system is operable to calibrate the interferometric displacement measuring system on the basis of a mirror shape reconstructed from the average of the angular positions.

7. The lithographic apparatus according to claim 1, wherein the calibration system is operable to calibrate the interferometric displacement measuring system on the basis of differences between the angular positions.

8. The lithographic apparatus according to claim 1, wherein:
 the interferometric displacement measuring system is further operable to measure displacements of the movable object in the second direction using a second measurement beam of radiation, the interferometric displacement measuring system including a second reflector, the second reflector being substantially planar and substantially perpendicular to the second direction;
 the control system is further operable to obtain a fourth set of measurements of the angular position of the movable object using the second measurement beam, effect a phase offset in the measurement beam and obtain a fifth set of measurements of the angular position of the movable object using the second measurement beam; and
 the calibration system is further operable to calibrate the interferometric displacement measuring system on the basis of the fourth and fifth sets of measurements.

9. The lithographic apparatus according to claim 1, further comprising a projection system for projecting an image onto a substrate, the projection system having an optical axis; and wherein the first and second directions are substantially perpendicular to the optical axis.

10. The lithographic apparatus according to claim 1, wherein the movable object is a substrate table configured to support a substrate or a support member configured to support a patterning device.

11. The lithographic apparatus according to claim 1, wherein the reflector is fixed to the movable object.

12. A method of calibrating an interferometric displacement measuring system operable to measure displacements of a movable object of a lithographic apparatus in a first direction and angular position of the movable object about an axis perpendicular to the first direction using a measurement beam of radiation, the interferometric displacement measuring system including a reflector, the reflector being substantially planar and substantially perpendicular to the first direction, the method comprising:
 obtaining a first set of measurements of the angular position of the movable object; effecting a phase that is the measurement beam;
 performing a second set of measurements of the angular position of the movable object; and
 calibrating the interferometric displacement measuring system on the basis of the first and second sets of measurements.

13. The method according to claim 12, wherein effecting the phase offset comprises displacing the movable object so that there is a distance between its position in the first direction when the first set of measurements is obtained and its position in the first direction when the second set of measurements are obtained.

14. The method according to claim 12, wherein the distance is substantially equal to $(a/b)\cdot(\lambda/c)$, where $\lambda$ is the wavelength of the measurement beam and a, b and c are integers.

15. The method according to claim 12, further comprising effecting a second phase offset and obtaining a third set of measurements of the angular of the movable object in the first direction while the movable object is held at a third position in the first direction and moved in the second direction.

16. The method according to claim 12, wherein the calibrating uses a mirror shape reconstructed from an average of the angular positions.

17. The method according to claim 12, wherein the calibrating uses differences between the angular positions.

18. The method according to claim 12, wherein the interfrometric displacement measuring system is further operable to measure displacements of the movable object in the second direction using a second measurement beam of radiation, the interferometric displacement measuring system including a second reflector, the second reflector being substantially planar and substantially perpendicular to the second direction, the method comprising obtaining a fourth set of measurements of the angular position of the movable object using the second measurement beam, effecting a phase offset in the second measurement beam;

obtaining a fifth set of measurements of the angular position of the movable object using the second measurement beam; and calibrating the interferometric displacement measuring system on the basis of the fourth and fifth sets of measurements.

19. The method according to claim 12, wherein the reflector is fixed to the movable object.

20. A device manufacturing method using a lithographic apparatus having a projection system to project an image onto a substrate held on a movable table, the method comprising:

calibrating an interferometric displacement measuring system operable to measure displacements of a movable object of the lithographic apparatus in a first direction and angular position about an axis perpendicular to the first direction using a measurement beam of radiation, the interferometric displacement measuring system including a reflector, the reflector being substantially planar and substantially perpendicular to the first direction; by obtaining a first set of measurements of the angular position movable object; effecting a phase offset in the measurement beam;

obtaining a second set of measurements of the angular position of the movable object; calibrating the interferometric displacement measuring system on the basis of the first and second sets of measurements;

projecting an image onto a substrate held on the movable table whilst scanning the movable table in the first direction; and controlling the movement of the movable table during the projecting with reference to displacements of the movable table measured by the interferometric displacement measuring system.

* * * * *

UNITED STATES PATENT AND TRADEMARK OFFICE
CERTIFICATE OF CORRECTION

PATENT NO. : 8,937,707 B2  Page 1 of 1
APPLICATION NO. : 13/551361
DATED : January 20, 2015
INVENTOR(S) : Jansen et al.

It is certified that error appears in the above-identified patent and that said Letters Patent is hereby corrected as shown below:

In the Claims

In col. 21, line 2, claim 14, please delete "(a/b)·(λ/c)" and insert --(a/b).(λ/c)--.

Signed and Sealed this
Eighth Day of September, 2015

Michelle K. Lee
*Director of the United States Patent and Trademark Office*